US006291872B1

(12) United States Patent
Wang et al.

(10) Patent No.: US 6,291,872 B1
(45) Date of Patent: Sep. 18, 2001

(54) THREE-DIMENSIONAL TYPE INDUCTOR FOR MIXED MODE RADIO FREQUENCY DEVICE

(75) Inventors: Ying-Lang Wang, Lung-Ching Hsiang; Hway-Chi Lin, Hsin-Chu; Jun Wu, Kwei-Shan Hsiang; Jowei Dun, Pao-Shan Hsiang, all of (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/433,255

(22) Filed: Nov. 4, 1999

(51) Int. Cl.[7] .................................................. H01L 29/00
(52) U.S. Cl. .......................................... 257/531; 257/752
(58) Field of Search ..................................... 257/531, 752

(56) References Cited

U.S. PATENT DOCUMENTS 5,936,298 * 8/1999 Capocelli et al. .................... 257/531
6,031,445 * 2/2000 Marty et al. ........................... 336/200
6,054,329 * 4/2000 Burghartz et al. ....................... 438/3

* cited by examiner

Primary Examiner—Sara Crane

(57) ABSTRACT

Vertical type structures for integrated circuit inductors are disclosed. These vertical type inductors include the single-loop type, the parallel-loop type and the screw type, which form three different embodiments in the present invention. In the first embodiment, three-dimensional type structures, a single-loop type is utilized as an integrated circuit inductor. This inductor structure is formed on a substrate and the axis of the structure is upright to the substrate. In another embodiment according to the present invention, a parallel-loop type structure for radio frequency (RF) integrated circuit inductor is provided. A screw type structure according to this invention is the third embodiment. It features an axis that is parallel to the surface of the substrate and threads into the semiconductor device.

19 Claims, 6 Drawing Sheets

THREE-DIMENSIONAL TYPE INDUCTOR FOR MIXED MODE RADIO FREQUENCY DEVICE

BACKGROUND OF THE INVENTION

1. Field of the Invention

The present invention relates to the structure of an inductor for mixed mode radio frequency (RF) integrated circuit devices, and more particularly to a vertical type inductor by using dual damascene process for mixed mode RF devices.

2. Description of the Prior Art

In recent years, for the brand new 0.18 um semiconductor process, there has been an increasing drive towards integrating high performance analog and digital circuitry on chip (mixed mode device). For the mixed mode radio frequency (RF) device, it needs to process the inductor on the electrical circuit. Current inductor is made by a horizontal aluminium-metal-line structure. The horizontal metal-line structure normally needs large area on chip. Especially, the resistance of aluminium is too high that leads the current small and the inductor performance impacted.

According to the above issue, normally a three-dimensional type structure is equivalent to a single-loop structure with a specific cross-section area that equals to the summation of cross-section area of each loop of the spiral structure. For a required inductance, the more loops inside the plane spiral structure the less area occupied by the plane spiral inductor. Therefore some disadvantages of the plane spiral structure are apparently observed, especially when the integrated circuit is highly integrated or the inductor is used by a radio frequency integrated circuit. The consumed space on the substrate by inductor is too large and the drawback is more obvious while integrated circuit is highly integrated or multilevel metallization is necessary.

SUMMARY OF THE INVENTION

In accordance with the present invention, the vertical-type structures for integrated circuit inductors are disclosed that substantially provides high inductance and improves the problem of energy dissipation by parasitic capacitor. Moreover, the vertical type inductors can also reduce the space on chip and increase the device density, hence decrease the production cost. Particularly, copper metal lines by using dual damascene process provide lower resistance and induce more current and then improve the inductor performance, thus this technology is widely applied to fabricate semiconductor device, especially to the 0.18 μm process in the future. In the following specification, three different sorts of embodiments including a single-loop, a parallel-loop and a screw type inductor are provided.

In the first embodiment, three-dimensional type structures, a single-loop type is utilized as an integrated circuit inductor. This inductor structure is formed on a semiconductor substrate and the axis of the structure is upright to the substrate. In another embodiment according to the present invention, a parallel-loop type structure for radio frequency (RF) integrated circuit inductor is provided. A screw type structure according to this invention is the third embodiment. It features an axis that is parallel to the surface of the substrate and threads into the semiconductor device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The structure of the present invention is applied to a broad range of inductors and can be fabricated from a variety of materials. The following description discusses several preferred embodiments of the structure of the present invention as implemented in inductors, since the majority of currently available structures are fabricated in three-dimensional-type, and the most commonly encountered applications of the present invention will involve inductance. Nevertheless, the present invention may also be advantageously employed in copper metal, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to inductors, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Figure 1A:
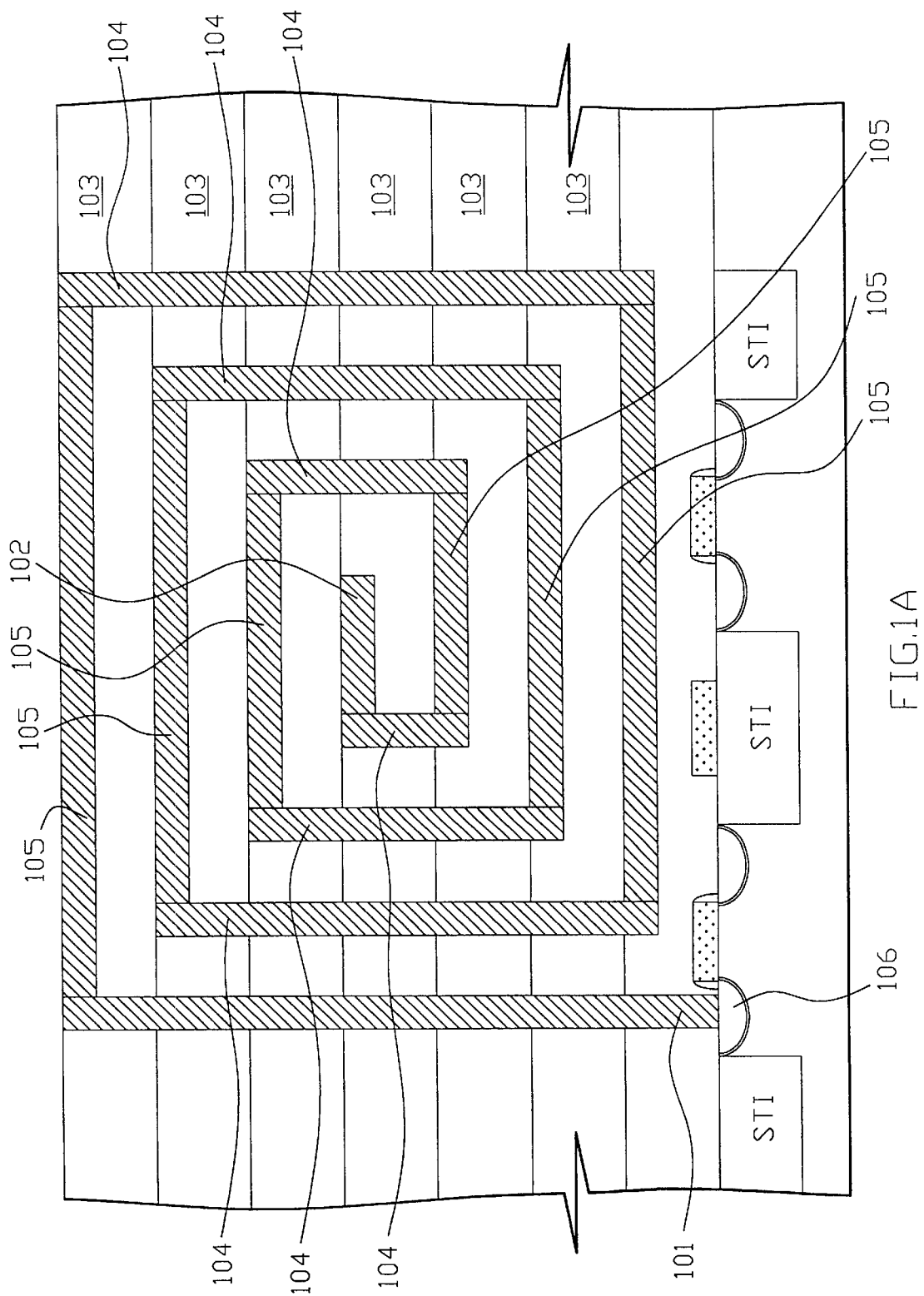
FIGS. 1A and 1B are illustrative of various components in the structure with first embodiment of the present invention.
Figure 1B:
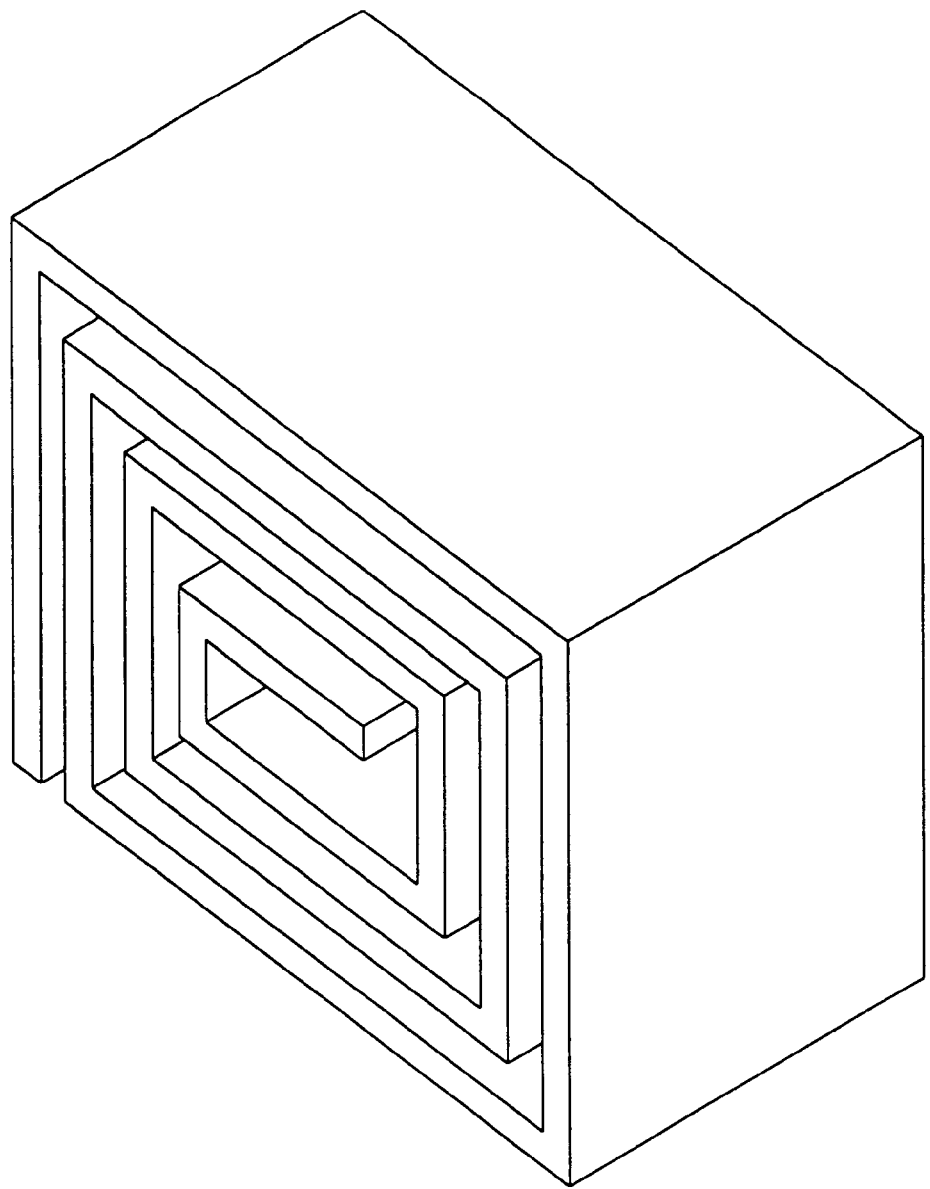

In the first preferred embodiment, referring to FIG. 1A and FIG. 1B, a three-dimensional type structure, a single-loop structure for integrated circuit inductor is provided. Basically, the cross sectional diagram is shown as FIG. 1A, the single-loop type inductor for mixed mode radio frequency (RF) devices comprising a rectangular spiral structure having an outer end 101 and an inner end 102. The rectangular spiral structure further comprises a plurality of inter-metal dielectric (IMD) layers 103, a plurality of vertical direction contacts 104 having different lengths, the inner the shorter, which are placed at equal intervals, and a plurality of horizontal direction contacts 105 having different lengths, the inner the shorter, which are placed at equal intervals as well. The outer end 101 can be regarded as one of the vertical direction contacts, and the inner end 102 can be one of the horizontal direction contacts or one of the vertical direction contacts. Every horizontal direction contact is formed within different insulating layer by using the well-known dual damascene process, and so does the formation of the vertical direction contacts. However, every vertical direction contact penetrates through at least one insulating layer and also connects to two horizontal direction contacts. And yet, the outer end is an exception of the vertical direction contacts, which is connected to one horizontal direction contact and to a source/drain region 106. Furthermore, the material used for the inter-metal dielectric layers 103 can be silicon dioxide ($SiO_2$), silicon nitride ($Si_3N_4$), phosphosilicate glass (PSG) or borophosphosilicate glass (BPSG), and the material used for the contacts (vertical direction contacts 104 and horizontal direction contacts 105) comprises copper metal or copper-aluminium metal. A three-dimensional diagram of the single-loop type inductor for mixed mode radio frequency (RF) devices is shown in FIG. 1B.

Figure 2A:
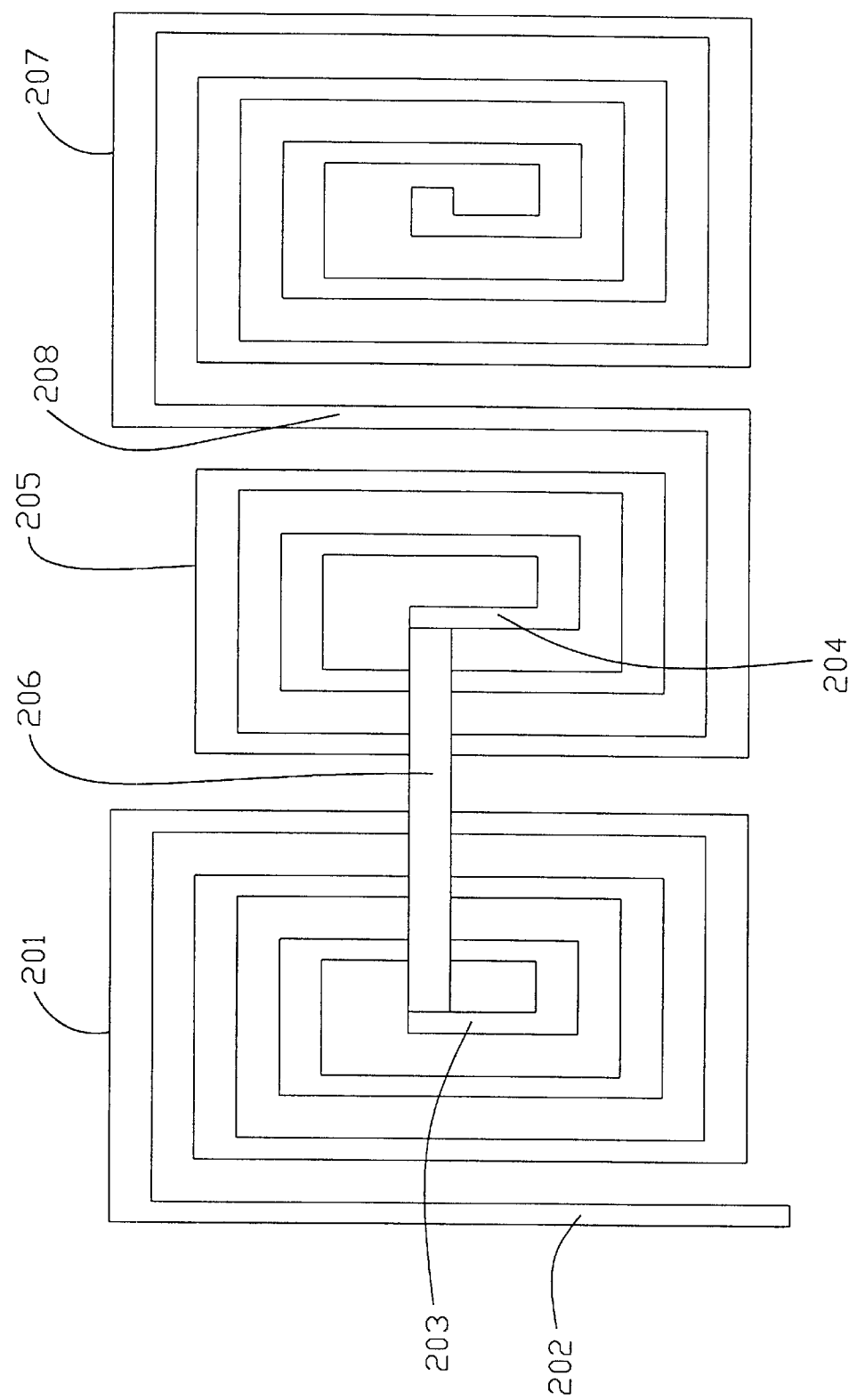
FIGS. 2A and 2B are schematic diagrams showing the structure of second embodiment of present invention.
Figure 2B:
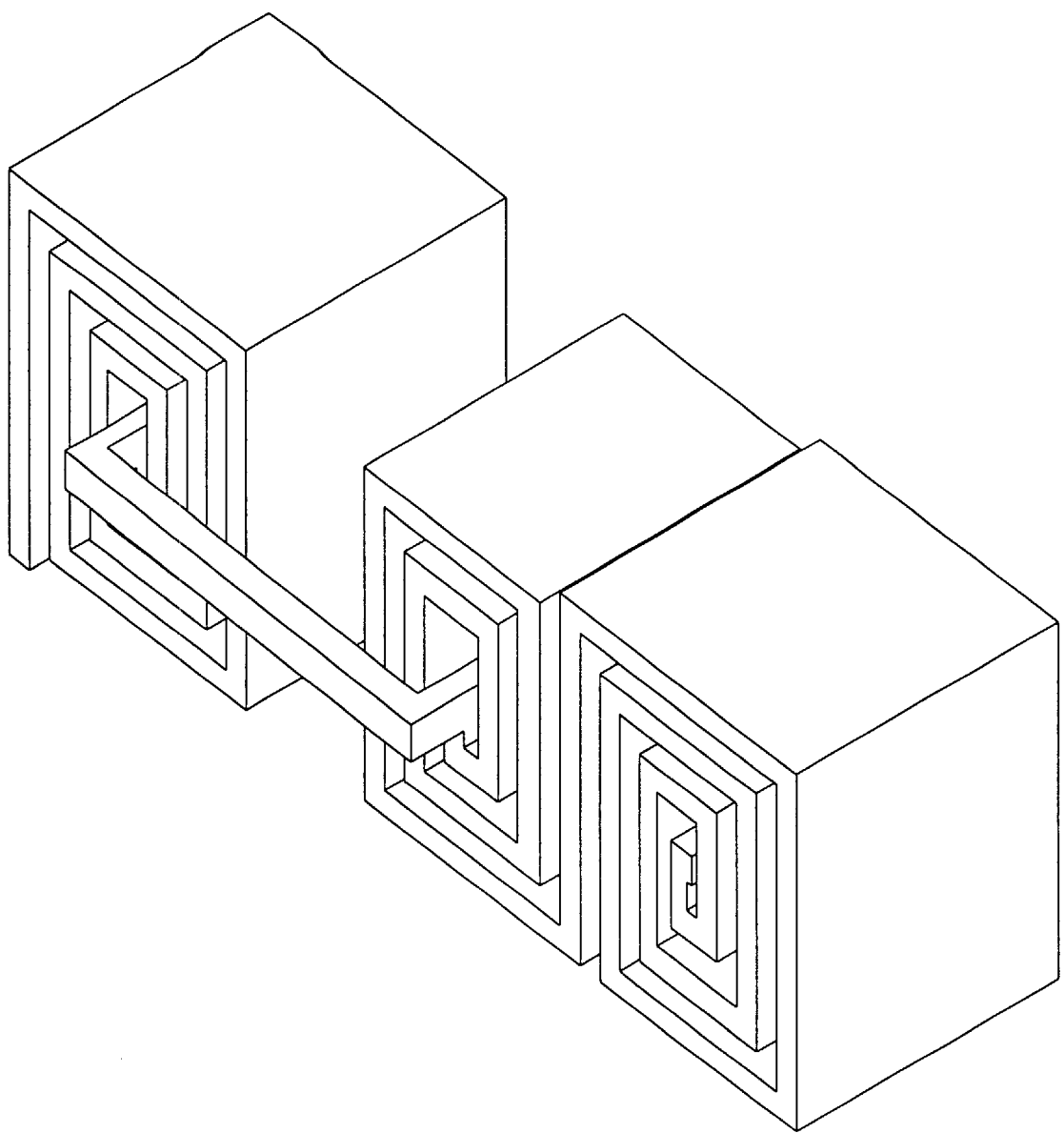

In another preferred embodiment of the present invention, FIG. 2A and FIG. 2B show a three-dimensional parallel-loop type structure. The parallel-loop type inductor for mixed mode radio frequency (RF) devices comprising at least two single-loop type inductors placed side by side with equal intervals. The single-loop type inductors are very similar to what has been described in the previous embodiment. Just for reminder, each of the single-loop type inductors includes a rectangular spiral structure having an outer end and an inner end. The rectangular spiral structure further comprises a plurality of insulating layers, a plurality of vertical direction contacts and a plurality of horizontal direction contacts. The outer end 202 of a first single-loop type inductor 201 is connected to the source/drain region 106 (referring to FIG. 1A), and the inner end 203 of the first single-loop type inductor 201 is connected to the inner end 204 of a second single-loop type inductor 205 by a cross contact 206. Moreover, the outer end of the second single-loop type inductor 205 overlaps the outer end of the third single-loop type inductor 207 at a vertical direction contact 208. Thereafter the inner end connects to the inner end and the outer end connects to the outer end. A three-dimensional diagram of the parallel-loop type inductor for mixed mode radio frequency (RF) devices is shown in FIG. 2B.

Figure 3A:
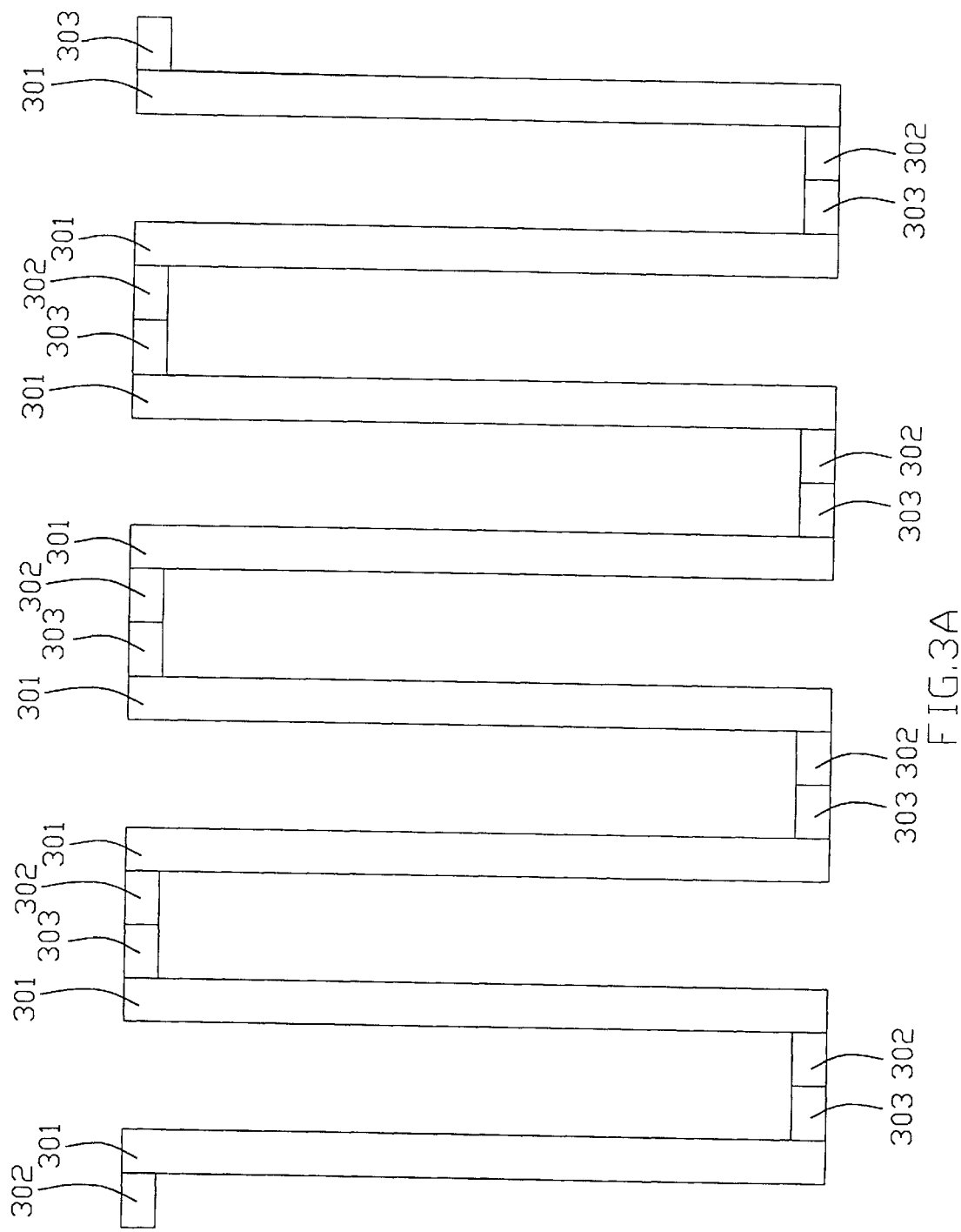
FIGS. 3A and 3B show schematic diagrams of screw structure in another embodiment.
Figure 3B:
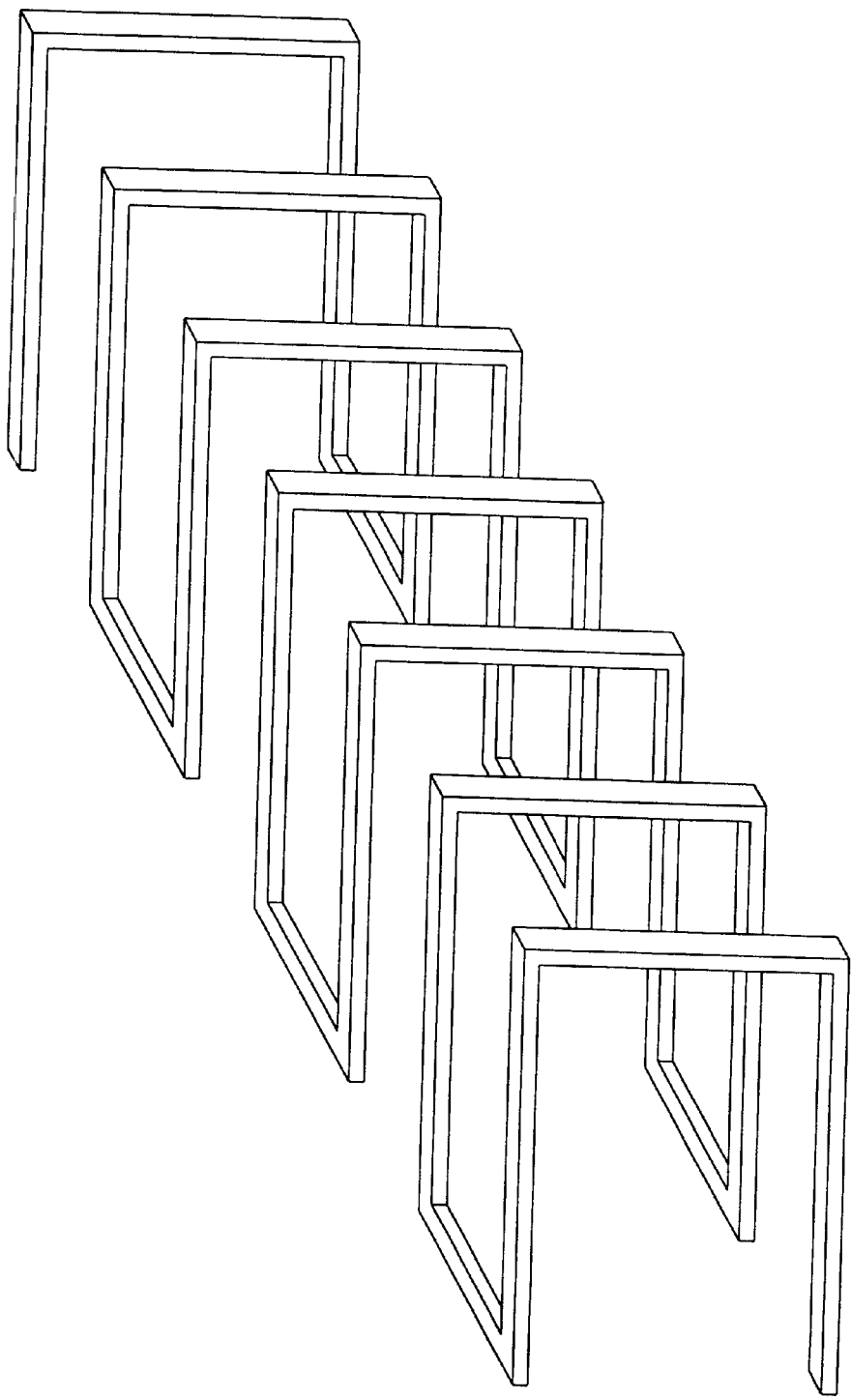

FIG. 3A and FIG. 3B show a three-dimensional screw structure in a further embodiment of the present invention. The screw type inductor for mixed mode radio frequency (RF) devices formed over a semiconductor wafer comprising a plurality of inter-metal dielectric layers and at least two vertical direction loops placed side by side with equal intervals and having the same axis parallel to the surface of the semiconductor wafer. Each of the vertical direction loops includes a rectangular-shape open looping section 301 having a first horizontal direction contact end 302 running to the left of the rectangular-shape open looping section and a second horizontal direction contact end 303 running to the right of the rectangular-shape open looping section. The vertical direction loops are formed within a range of more than one inter-metal dielectric layer by using dual damascene process, and the vertical direction loops are joined to each other by connecting the second horizontal contact end of one vertical direction loop to the first horizontal contact end of another vertical direction loop. Moreover, perimeters of the vertical direction loops are equal, the first horizontal direction contact ends of the vertical direction loop are placed within two separated insulating layers, and the second horizontal direction contact ends of the vertical direction loops are also placed within those two separated insulating layers. Furthermore, the material used for the inter-metal dielectric layers can be silicon di oxide ($SiO_2$), silicon nitride ($Si_3N_4$), phosphosilicate glass (PSG) or borophosphosilicate glass (BPSG), and the material used for the vertical direction loops comprises copper metal or copper-aluminium metal. A three-dimensional diagram of the screw type inductor for mixed mode radio frequency (RF) devices is shown in FIG. 3B.

Due to both the contact length and the loop size are adjustable and feasible to regulate, the cross-sectional area of each type of the inductors is controllable and the inductance provided by the inductors can be adjusted precisely. Another obvious advantage is that as the occupied area of inductor is decreasing, the forming probability of parasitic capacitor also is decreasing, such that the effect of parasitic capacitor is declining and then the energy dissipation is reduced. For radio frequency integrated circuit, the advantage is more important for energy dissipation by parasitic capacitor will the inductor quality factor.

Therefore, there are three embodiments according to the present invention. In the first embodiment, three-dimensional type structures, a single-loop type is utilized as an integrated circuit inductor. This inductor structure is formed on a substrate and the axis of the structure is upright to the substrate. In another embodiment according to the present invention, a parallel-loop type structure for radio frequency (RF) integrated circuit inductor is provided. A screw type structure according to this invention is the third embodiment. It features an axis that is parallel to the surface of the substrate and threads into the semiconductor device.

Although specific embodiments have been illustrated and described, it will be obvious to those skilled in the art that various modifications may be made without departing from what is intended to be limited solely by the appended claims.

What is claimed is:

1. A single loop type inductor for mixed mode radio frequency (RF) devices comprising:
   a rectangular spiral structure having an outer end and an inner end, said rectangular spiral structure further comprises a plurality of insulating layers, a plurality of vertical direction contacts and a plurality of horizontal direction contacts,
   every horizontal direction contact is formed within different insulating layer by dual damascene process, and
   every vertical direction contact is also formed by dual damascene process but through at least one insulating layer and connected to two horizontal direction contacts.

2. The inductor according to claim 1, wherein said plurality of vertical direction contacts have different lengths, the inner the shorter, and are placed at equal intervals.

3. The inductor according to claim 1, wherein said plurality of horizontal direction contacts have different lengths, the inner the shorter, and are placed at equal intervals.

4. The inductor according to claim 1, wherein said outer end is one of said plurality of vertical direction contacts, which is connected to one horizontal direction contact and to a source/drain region.

5. The inductor according to claim 1, wherein said inner end is one of said plurality of horizontal direction contacts, which is connected to one vertical direction contact only.

6. The inductor according to claim 1, wherein said inner end is one of said plurality of vertical direction contacts, which is connected to one horizontal direction contact only.

7. The inductor according to claim 1, wherein the material used for said contacts comprises copper metal.

8. The inductor according to claim 1, wherein the material used for said contacts comprises copper-aluminium metal.

9. The inductor according to claim 1, wherein said insulating layers are inter-metal dielectric layers and the material used for said insulating layers comprises silicon dioxide.

10. A parallel loop type inductor for mixed mode radio frequency (RF) devices comprising:
    at least two single loop type inductors, each of said single loop type inductors including, a rectangular spiral structure having an outer end and an inner end, said rectangular spiral structure further comprises a plurality of insulating layers, a plurality of vertical direction contacts and a plurality of horizontal direction contacts, every horizontal direction contact is formed within different insulating layer by dual damascene process, and every vertical direction contact is also formed by dual damascene process but through at least one insulating layer and connected to two horizontal direction contacts;

the outer end of a first single loop type inductor is connected to a source/drain region, and the inner end of said first single loop type inductor is connected to the inner end of a second single loop type inductor, thereafter the inner end connects to the inner end and the outer end connects to the outer end.

11. The inductor according to claim 10, wherein said plurality of vertical direction contacts have different lengths, the inner the shorter, and are placed at equal intervals.

12. The inductor according to claim 10, wherein said plurality of horizontal direction contacts have different lengths, the inner the shorter, and are placed at equal intervals.

13. The inductor according to claim 10, wherein said single loop type inductor s are placed side by side with equal intervals.

14. The inductor according to claim 10, wherein said outer end is one of said plurality of vertical direction contacts, which is connected to either said source/drain region or the outer end of another single loop type inductor.

15. The inductor according to claim 10, wherein said inner end is one of said plurality of horizontal direction contacts, which is connected to the inner end of another single loop type inductor.

16. The inductor according to claim 10, wherein said inner end is one of said plurality of vertical direction contacts, which is connected to the inner end of another single loop type inductor.

17. The inductor according to claim 10, wherein the material used for said contacts comprises copper metal.

18. The inductor according to claim 10, wherein the material used for said contacts comprises copper-aluminium metal.

19. The inductor according to claim 10, wherein said insulating layers are inter-metal dielectric layers and the material used for said insulating layers comprises silicon dioxide.

* * * * *